(12) United States Patent
Garner et al.

(10) Patent No.: US 6,281,603 B1
(45) Date of Patent: Aug. 28, 2001

(54) PULSE LINE GENERATORS

(75) Inventors: Paul A. J Garner, Chelmsford; Christopher J Hodge, Ingatestone, both of (GB)

(73) Assignee: Bae Systems Electronics Limited (GB)

( * ) Notice: Subject to any disclaimer, the term of this patent is extended or adjusted under 35 U.S.C. 154(b) by 0 days.

(21) Appl. No.: 09/429,686

(22) Filed: Oct. 28, 1999

(30) Foreign Application Priority Data

Nov. 30, 1998 (GB) .................................................. 9826169

(51) Int. Cl.$^7$ ...................................................... H03K 3/53
(52) U.S. Cl. ............................................. 307/104; 307/106
(58) Field of Search .................................. 307/104, 106, 307/107, 108

(56) References Cited

U.S. PATENT DOCUMENTS

| 3,892,970 | * | 7/1975 | Freeman et al. | 376/105 |
| 4,070,579 | * | 1/1978 | Brewster | 378/106 |
| 4,717,834 | * | 1/1988 | Levy | 307/106 |
| 4,818,892 | * | 4/1989 | Oohashi et al. | 307/106 |
| 5,192,827 | * | 3/1993 | Jasper, Jr. | 89/1.11 |
| 5,412,254 | * | 5/1995 | Robinson et al. | 307/106 |
| 5,444,308 | * | 8/1995 | O'Loughlin | 307/106 |
| 5,567,995 | * | 10/1996 | O'Loughlin et al. | 307/106 |
| 5,650,670 | * | 7/1997 | Thaxter | 307/106 |
| 6,066,901 | * | 5/2000 | Burkhart et al. | 307/106 |

\* cited by examiner

*Primary Examiner*—Josie Ballato
*Assistant Examiner*—Roberto Rios
(74) *Attorney, Agent, or Firm*—Kirschstein, et al.

(57) ABSTRACT

A pulse generator comprises a pulse forming line having a helical core winding surrounded by an outer winding, and a transformer having primary and secondary windings. The secondary winding is arranged about the core winding and the primary winding is arranged to co-act with the secondary winding such that the primary winding energizes the secondary winding when a suitable voltage is applied to the primary winding by a charging circuit connected to either end of the winding. The secondary winding through transformer action charges the pulse forming line. The pulse forming line has a load and a switch connected between the core winding and the outer winding. At the appropriate time the switch is closed such that energy stored in the line is discharged to the load as a pulse.

14 Claims, 1 Drawing Sheet

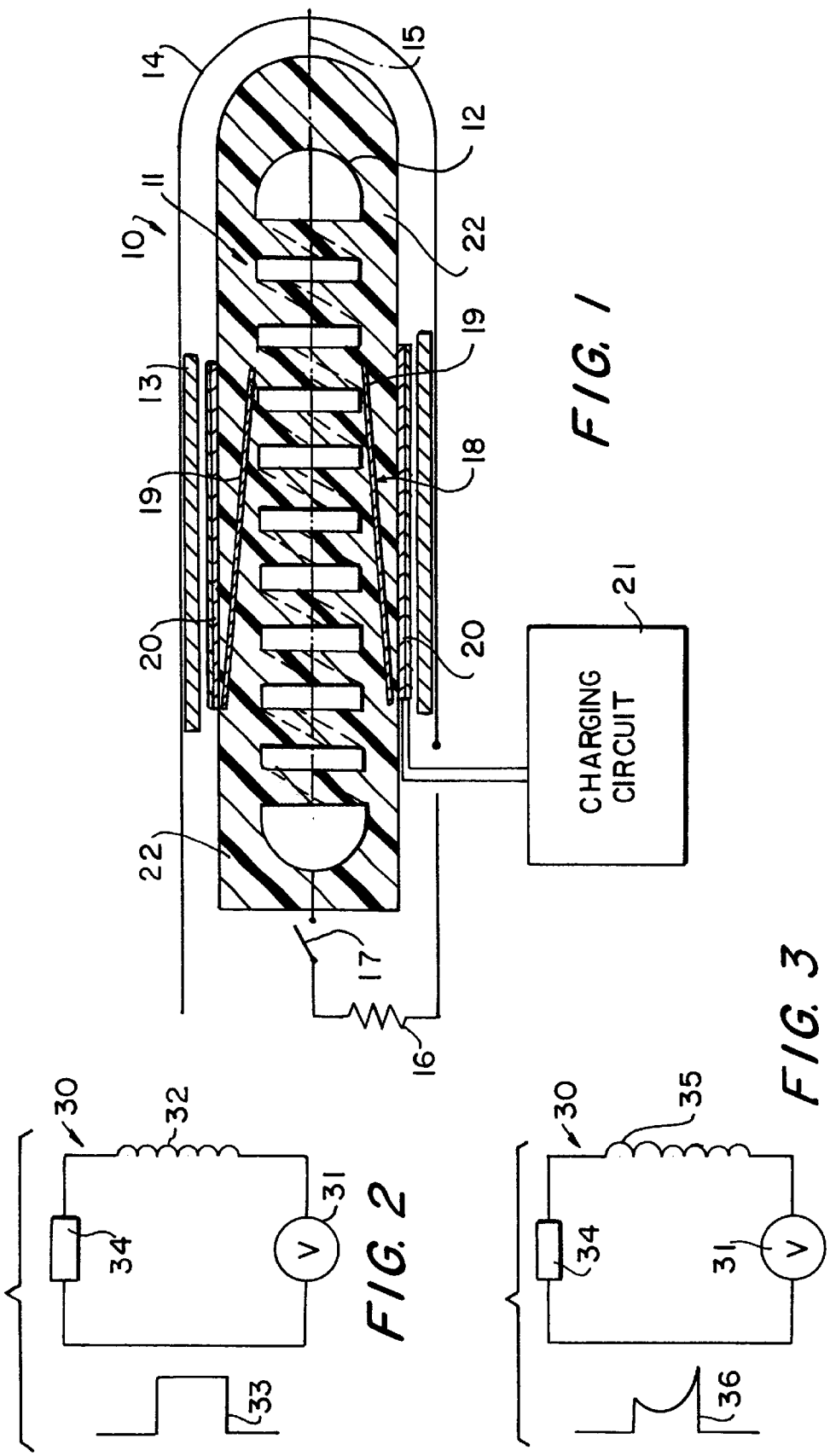

PULSE LINE GENERATORS

BACKGROUND OF THE INVENTION

This invention relates to a pulse line generator, in particularly to a pulse generator having a pulse forming line with an integrated charging transformer.

It is known to provide a pulse generator having a helical type pulse forming line which achieves a pulse duration in the order of 200 to 300 nanoseconds per linear meter of pulse forming line and which is fed by an external transformer. This pulse generator can produce a high voltage pulse, typical greater than 10 kilovolts. However, the pulse forming line and a suitable charging transformer can occupy considerable space. In certain applications the space available for the pulse forming line and its charging transformer is limited.

SUMMARY OF THE INVENTION

The invention arose out of consideration of ways to reduce the dimensions of a pulse generator.

According to the invention a pulse generator comprises a pulse forming line having a helical core winding surrounded by an outer winding, and a transformer having primary and secondary windings, the secondary winding being arranged about the core winding and the primary winding being arranged to co-act with the secondary winding such that the primary winding energizes the secondary winding when a suitable voltage is applied to the primary winding and that the secondary winding through a transformer action charges the pulse forming line.

In this manner a helical pulse forming line and its charging transformer can be combined in a single unit thereby reducing the overall dimensions of the pulse generator.

The core winding and outer winding may be arranged substantially coaxially. The core winding, outer winding and primary and secondary windings may each comprise a plurality of conductors.

Each conductor of the core winding may be helical in configuration and may be formed of ferromagnetic material. The core winding may be covered by a non-magnetic conductive metal.

Preferably, the outer winding may be a containment vessel for the core winding and primary and secondary windings.

The secondary winding may be conical shaped.

The primary winding may be formed of foil which may be enclosed in a ferromagnetic shielding.

The primary and secondary windings may be arranged substantially coaxially with the core winding.

The containment vessel may be substantially filled with dielectric insulation which may be a solid.

Preferably the pulse forming line may be connected to a switch to allow discharge of a pulse from the pulse forming line to a load.

The characteristics of a pulse discharged from the pulse forming line may be adjusted by varying the pitch of each conductor of the core winding.

BRIEF DESCRIPTION OF THE DRAWINGS

The invention will now be described, by example only, with reference to the accompanying drawings, in which:

FIG. 1 illustrates one embodiment of the present invention;

FIG. 2 illustrates schematically the electrical circuit formed by the present invention; and FIG. 3 illustrates schematically a further electrical circuit formed by the present invention.

DETAILED DESCRIPTION OF THE PREFERRED EMBODIMENT

In FIG. 1, a pulse generator 10 comprises a helical pulse forming line 11, having a helical wound conductor core winding 12 and outer winding 13 integral with or within a containment vessel 14. The core winding 12 has a central longitudinal axis 15 and the outer-winding 13 is arranged coaxially with the central axis 15. The core winding 12 and outer winding 13 are formed from a plurality of conductors wound in such a fashion so as to form the pulse forming line 11. The core winding 12 is formed from a ferromagnetic material and covered by a non-magnetic conductive material, not shown.

The pulse forming line 11 has a load 16 and switch 17 connected between the core winding 12 and outer winding 13.

Between the core winding 12 and outer winding 13, there is arranged a charging transformer 18 which comprises a conically-shaped secondary winding 19 arranged coaxially with the central axis 15 of the core winding 12. The transformer 18 also comprises a primary winding 20 formed from foil that is wound around the internal surface of the containment vessel 14, if the outer winding 13 is integral with the containment vessel 14, or is wound around the internal surface of the outer winding 13, if the outer winding 13 is not integral with the containment vessel, and is enclosed in a ferromagnetic shielding, not shown such that magnetic flux which couples the primary 20 and secondary 19 windings is shielded from the outer winding 13. The primary winding 20 is also arranged coaxially with the central axis 15 of the core winding 12.

Each end of the primary winding 20 is connected to a charging circuit 21. The primary winding 20 and secondary winding 19 are formed from a plurality of conductors which are wound in such a fashion so as to form the transformer 18 which has a magnetic core formed by the core winding 12.

It should be noted that the core winding 12 provides a dual function, namely it is the winding of the pulse forming line 11 and the magnetic core of the charging transformer 18. The containment vessel 14 is filled with a dielectric insulation 22 to insulate the core winding 12 and secondary winding 19 from one another. In this embodiment the dielectric insulation 22 is formed from a solid material.

In operation, the charging circuit 21 provides a suitable voltage to the primary winding 20 and the secondary winding 19 is energized by induction. By transformer action, the core winding 12 of the pulse forming line 11 is energized with a suitable charge. At the appropriate time, the switch 17 is closed such that energy stored in the pulse forming 11 line is discharged to the load 16 is the form of a pulse. The switch 17 is then opened such that consecutive pulses can be formed by the pulse forming line 11 in a similar manner.

When forming the pulse generator 10 the charging transformer 18 should not compromise the operation of the helical pulse line 11. In such a pulse generator 10 the pulse forming line 11 produces a circumferential current component as well as an axial current component. To provide adequate permeability for efficient transformer action during charging of the pulse forming line 11 and to allow circumferential currents to flow during discharging of the pulse forming line 11, the pitch of the helix winding of the core winding 12 and the material from which it is formed is selected to allow a high pulse permeability during charging of the pulse forming line 11 and to reduce to substantially unity during discharging of the pulse forming line 11. In this manner, the inductance of the pulse forming line 11 per helix turn is equal to that of the core winding 12 to ensure correct action of the pulse forming line.

Therefore the pulse forming line 11 and its charging transformer 18 can be combined in a single unit to reduce the overall dimensions of the pulse generator 10. The pulse forming line 11 is capable of producing high voltage and high powered pulses, typically having a duration in the range of 10 nanoseconds to 1 microsecond and an amplitude of 5 kilowatts.

Generally, the output pulse length and impedance of the pulse generator is determined by the construction of the overall assembly. FIG. 2 illustrates that in common applications, a pulse forming line 30 comprises, for the purpose of simplification, a voltage source 31 in series with a resistor 32 having a constant pitch winding which will produce a constant impedance along the pulse forming line 30 thereby producing a flat top trapezoidal voltage pulse 33 in a load 34. The load 34 can be a microwave device. However, the impedance of the pulse forming line 30 can be adjusted by altering the pitch of the helical core winding in this case represented by resistor 32.

In FIG. 3 the same references as those used in FIG. 2 have been used to represent similar integers. By varying the winding pitch of a resistor 35 the impedance along the pulse forming line 30 can be altered to delay a pulse 36 produced at particular points in time. This has the effect of altering the shape of the pulse 36 at the load 34. For example, a ramp pulse 36 may be produced by varying the pitch of the resistor 35 winding thereby producing a voltage change which is converted into a frequency in the output load 34.

What is claimed is:

1. A pulse generator, comprising a pulse forming line having a helical core winding surrounded by an outer winding, and a transformer having primary and secondary windings, the secondary winding being arranged about the core winding and the primary winding being arranged to co-act with the secondary winding such that the primary winding energized the secondary winding when a suitable voltage is applied to the primary winding and that the secondary winding trough a transformer action charges the pulse forming line.

2. A pulse generator, as in claim 1, wherein the core winding and outer winding are arranged substantially coaxially.

3. A pulse generator, as in claim 1, wherein the core winding, outer winding and primary and secondary windings each comprise a plurality of conductors.

4. A pulse generator, as in claim 1, wherein the core winding is formed of ferromagnetic material.

5. A pulse generator, as in claim 1, wherein the core winding is covered by a non-magnetic conductive metal.

6. A pulse generator, as in claim 1, wherein the outer winding is a containment vessel for the core winding and primary and secondary windings.

7. A pulse generator, as in claim 1, wherein the secondary winding is conical shaped.

8. A pulse generator, as in claim 1, wherein the primary winding is formed of foil.

9. A pulse generator, as in claim 1, wherein the primary winding is enclosed in a ferromagnetic shielding.

10. A pulse generator, as in claim 1, wherein the primary and secondary windings are arranged substantially coaxially with the core winding.

11. A pulse generator, as in claim 6, wherein the containment vessel is substantially filled with dielectric insulation.

12. A pulse generator as in claim 11, wherein the dielectric insulation is solid.

13. A pulse generator, as in claim 3, wherein the pulse forming line is connected to a switch to allow discharge of a pulse from the pulse forming line to a load.

14. A pulse generator, as in claim 13, wherein the characteristics of a pulse discharged from the pulse forming line can be adjusted by varying the pitch of each conductor of the core winding.

* * * * *